(12) United States Patent
Hanson et al.

(10) Patent No.: US 11,961,888 B2
(45) Date of Patent: Apr. 16, 2024

(54) EXTRINSIC FIELD TERMINATION STRUCTURES FOR IMPROVING RELIABILITY OF HIGH-VOLTAGE, HIGH-POWER ACTIVE DEVICES

(71) Applicant: MACOM Technology Solutions Holdings, Inc., Lowell, MA (US)

(72) Inventors: Allen W. Hanson, Cary, NC (US); Chuanxin Lian, Westford, MA (US); Wayne Mack Struble, Franklin, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 560 days.

(21) Appl. No.: 17/263,366

(22) PCT Filed: Aug. 6, 2019

(86) PCT No.: PCT/US2019/045340
§ 371 (c)(1),
(2) Date: Jan. 26, 2021

(87) PCT Pub. No.: WO2020/033431
PCT Pub. Date: Feb. 13, 2020

(65) Prior Publication Data
US 2021/0296452 A1    Sep. 23, 2021

Related U.S. Application Data

(60) Provisional application No. 62/714,826, filed on Aug. 6, 2018.

(51) Int. Cl.
*H01L 29/40* (2006.01)
*H01L 21/76* (2006.01)
(Continued)

(52) U.S. Cl.
CPC ........ *H01L 29/402* (2013.01); *H01L 21/7605* (2013.01); *H01L 21/765* (2013.01);
(Continued)

(58) Field of Classification Search
CPC ........... H01L 29/1083; H01L 29/42368; H01L 29/0692; H01L 29/0696; H01L 29/2003;
(Continued)

(56) References Cited

U.S. PATENT DOCUMENTS 10,541,323 B2 * 1/2020 Boles .................. H01L 29/7787
10,622,467 B2 * 4/2020 Boles .................. H01L 29/0653
(Continued)

FOREIGN PATENT DOCUMENTS

JP    2009054632 A      3/2009
JP    2010147349 A  *   7/2010   ........... H01L 21/338
(Continued)

OTHER PUBLICATIONS

Machine translation, Sato, Japanese Pat. Pub. No. JP2010147349A, translation date: Aug. 9, 2023, Espacenet, all pages. (Year: 2023).*
(Continued)

*Primary Examiner* — Victoria K. Hall
(74) *Attorney, Agent, or Firm* — Perilla Knox & Hildebrandt LLP; Jason M. Perilla (57) ABSTRACT

Extrinsic structures formed outside the active regions of active devices can influence aging characteristics and performance of the active devices. An example integrated device including such an intrinsic structure includes a semiconductor device having an active region in a conduction layer, an isolation region in the conduction layer, an insulating layer formed over at least a portion of the active region and over at least a portion of the isolation region, a via outside the active region, and a conductive interconnect. The isolation region extends around the semiconductor (Continued)

device in an area outside the active region. The via extends through the insulating layer and down to the isolation region in the conduction layer, and the conductive interconnect is formed directly on the isolation region in the conduction layer.

20 Claims, 4 Drawing Sheets

(51) Int. Cl.
    *H01L 21/765*    (2006.01)
    *H01L 29/06*     (2006.01)
    *H01L 29/20*     (2006.01)
    *H01L 29/778*    (2006.01)
    *H01L 29/872*    (2006.01)

(52) U.S. Cl.
    CPC ...... *H01L 29/0692* (2013.01); *H01L 29/2003* (2013.01); *H01L 29/7786* (2013.01); *H01L 29/872* (2013.01)

(58) Field of Classification Search
    CPC ... H01L 29/205; H01L 29/452; H01L 29/475; H01L 29/66462; H01L 29/778–7789; H01L 29/872; H01L 29/8725; H01L 21/7605
    See application file for complete search history.

(56) References Cited

U.S. PATENT DOCUMENTS

| | | | | |
|---|---|---|---|---|
| 10,651,317 | B2* | 5/2020 | Kaleta | H01L 29/66143 |
| 2005/0145851 | A1* | 7/2005 | Johnson | H01L 29/7787 |
| | | | | 257/E21.407 |
| 2009/0050900 | A1* | 2/2009 | Masuda | H01L 29/66462 |
| | | | | 257/E29.081 |
| 2013/0075789 | A1* | 3/2013 | Kanamura | H03F 1/3247 |
| | | | | 257/E21.409 |
| 2014/0042544 | A1* | 2/2014 | Karino | H01L 27/0277 |
| | | | | 257/355 |
| 2015/0076506 | A1 | 3/2015 | Yasumoto et al. | |
| 2015/0137135 | A1* | 5/2015 | Green | H01L 21/0272 |
| | | | | 438/237 |
| 2015/0179741 | A1* | 6/2015 | Umeda | H01L 29/7786 |
| | | | | 257/389 |
| 2015/0279982 | A1* | 10/2015 | Yamamoto | H01L 29/42368 |
| | | | | 438/172 |
| 2017/0358495 | A1 | 12/2017 | Jiang | |
| 2020/0105741 | A1* | 4/2020 | Lin | H01L 21/761 |

FOREIGN PATENT DOCUMENTS

| | | |
|---|---|---|
| JP | 2010147349 A | 7/2010 |
| JP | 2013074069 A | 4/2013 |
| WO | 2014041731 A1 | 3/2014 |

OTHER PUBLICATIONS

Office Action for European Application No. 19759459.1 dated Aug. 22, 2022.
International Search Report for PCT/US2019/045340 dated Jan. 2, 2020.
JP Office Action dated May 30, 2023, With Translation.
JP Office Action for Application No. 2021-502439 mailed Nov. 14, 2023, With Translation.

* cited by examiner

EXTRINSIC FIELD TERMINATION STRUCTURES FOR IMPROVING RELIABILITY OF HIGH-VOLTAGE, HIGH-POWER ACTIVE DEVICES

CROSS REFERENCE TO RELATED APPLICATIONS

This application is a 35 U.S.C. § 371 national stage entry of Patent Cooperation Treaty Application number PCT/US2019/045340, filed on Aug. 6, 2019, and titled "EXTRINSIC FIELD TERMINATION STRUCTURES FOR IMPROVING RELIABILITY OF HIGH-VOLTAGE, HIGH-POWER ACTIVE DEVICES," which claims the benefit of priority to U.S. Provisional Application No. 62/714,826, filed Aug. 6, 2018, the entire contents of both of which applications are hereby incorporated herein by reference.

BACKGROUND

Technical Field

The technology relates to high-voltage, high-power active devices having interconnects outside the active areas of the device that improve reliability of the device.

Discussion of the Related Art

Applications involving wireless communications, radar, microwave heating, and remote sensing, for example, can require circuits that produce high-frequency signals (e.g., radio-frequency (RF) signals or microwaves) at high power levels (e.g., power levels of 50 Watts to 1000 Watts or even higher). Such circuits can include integrated circuit devices (e.g., transistors, capacitors, diodes, inductors, etc.) that handle such high power levels. In recent years, there have been significant improvements in integrated circuit devices that can handle high-frequency, high-power signals.

Because of its wide bandgap, gallium nitride is more resistant to avalanche breakdown and has a higher intrinsic field strength compared to more common semiconductor materials, such as silicon and gallium arsenide. In addition, gallium nitride is a wide bandgap semiconductor and is able to maintain its electrical performance at higher temperatures as compared to other semiconductors, such as silicon or gallium arsenide. GaN has a Wurtzite crystal structure, is a hard material, has a high thermal conductivity, and has a much higher melting point than other conventional semiconductors such as silicon, germanium, and gallium arsenide. GaN also has a higher carrier saturation velocity compared to silicon. Accordingly, gallium-nitride materials have become desirable materials for fabricating integrated circuit devices that can handle high-frequency, high-power signals.

SUMMARY

Structures and methods for improving reliability of high-voltage, high-power active devices (such as transistors and diodes) are described. The active devices can be formed from gallium-nitride material deposited on a substrate of a different material (e.g., silicon or silicon carbide) and can handle power levels between 50 Watts to 1000 Watts. An active device can comprise a plurality of individual transistors or diodes connected in parallel. Interconnects between same types of terminals or electrodes (e.g., between gate electrodes or anode electrodes) of the individual transistors or diodes are patterned outside active areas of the individual devices and formed in a way that reduces age-dependent leakage current and improves device reliability and longevity. The high-voltage, high-power active devices can be used for high-frequency power electronics (e.g., frequencies between 100 MHz and 20 GHz) and are useful for microwave applications including radar and RF communications applications among other applications.

Some embodiments relate to an active device comprising gallium-nitride material. The active device can include a plurality of transistors or diodes connected together in parallel. The active device can include an isolation region located in a region outside active areas of the transistors or diodes and at least one interconnect directly contacting the isolation region, wherein the at least one interconnect electrically connects same electrodes of the transistors or diodes.

Some embodiments relate to an integrated device comprising a semiconductor device having an active region, a first insulating layer formed over at least a portion of the active region, an isolation region lying outside the active region and lacking the first insulating layer, and a conductive interconnect formed over the isolation region.

Some embodiments relate to a method of forming a semiconductor device having an active region on a substrate. The method may comprise acts of forming a first insulating layer that covers at least a portion of the active region; creating an isolation region in an area outside the active region; forming a via over the isolation region wherein a portion of the first insulating layer is removed from the isolation region; and depositing a conductive interconnect that extends into the via and onto the isolation region.

Some embodiments relate to a method of forming an active device comprising gallium-nitride material. The method can comprise acts of forming a plurality of transistors or diodes from semiconductor materials that include at least one layer of gallium-nitride material, forming an isolation region outside active areas of the transistors or diodes, and forming at least one interconnect directly contacting the isolation region, wherein the at least one interconnect electrically connects same electrodes of the transistors or diodes.

The foregoing aspects, features, and implementations may be included in any suitable combination with aspects and features described in further detail below in an embodiment of a HEMT. The aspects, features, and embodiments of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabricated circuits, only one device and/or circuit may be shown to simplify the drawings. In practice, a large number of devices or circuits may be fabricated in parallel across a large area of a substrate or entire substrate. Additionally, a depicted device or circuit may be integrated within a larger circuit.

When referring to the drawings in the following detailed description, spatial references "top," "bottom," "upper," "lower," "vertical," "horizontal," "above," "below" and the like may be used. Such references are used for teaching purposes, and are not intended as absolute references for embodied devices. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

Microwave and radio frequency (RF) systems often include circuitry arranged to translate a frequency of a signal to a higher or lower frequency value. Frequency translation can occur in applications involving wireless transmission and receiving of signals. For example, a signal that is modulated at a first rate to encode data may be mixed onto a high-frequency carrier wave to transmit the data, and may later be down-converted at a receiver to decode the data. Some applications may involve amplification and/or switching of an RF or microwave signal at frequencies over several hundred megahertz and well into the gigahertz regime, e.g., for wireless communications and radar applications. Some of these applications can further require high power levels (e.g., at power levels between 50 Watts and 1000 Watts).

Because of their high speed and power-handling capability, high-electron-mobility transistors (HEMTs) and Schottky diodes are useful for such applications. Because large currents and relatively high voltages can be present in these applications, it is desirable for a HEMT or Schottky diode to withstand high reverse-bias potentials, and to have low leakage currents. The inventors have recognized and appreciated that leakage currents can reduce device efficiency and degrade device performance over time. Degraded performance can be manifested as shifts in threshold voltage and/or shifts in channel resistance. In some cases, the leakage currents can become too high over time such that the device may subsequently fail to meet the device's original specifications (e.g., taking a circuit out of compliance), or the device may damage.

As an example for HEMT devices operating below saturation (in back-off), the gate leakage current can be negative in polarity. The negative leakage current can prove to be problematic for some bias circuits that are used to bias the device if the value of the leakage current increases significantly in magnitude over time. More specifically, for gate bias circuits involving resistive elements, this negative current can act to increase the drain current by means of a positive feedback mechanism. Since gate leakage generally increases with temperature and an increase in drain current results in increased power dissipation (hence temperature), such a device can experience thermal runaway—a condition that can destroy the device. To insure this does not occur—technical device qualification must be cognizant of this degradation mechanism and insure that reasonable leakage levels can be maintained over the life of the device.

Although the following description relates primarily to HEMT type transistors, the invention is not limited to only this type of transistor. The inventive embodiments are applicable to other types of transistors and diodes (e.g., MOSFETs, MISFETs, JFETs, bipolar junction transistors, multi-drain FETs, insulated-gate bipolar junction transistors, Schottky diodes, PIN diodes, etc.) that comprise a plurality of individual devices connected in parallel with interconnects lying outside active regions of the devices.

Figure 1A:
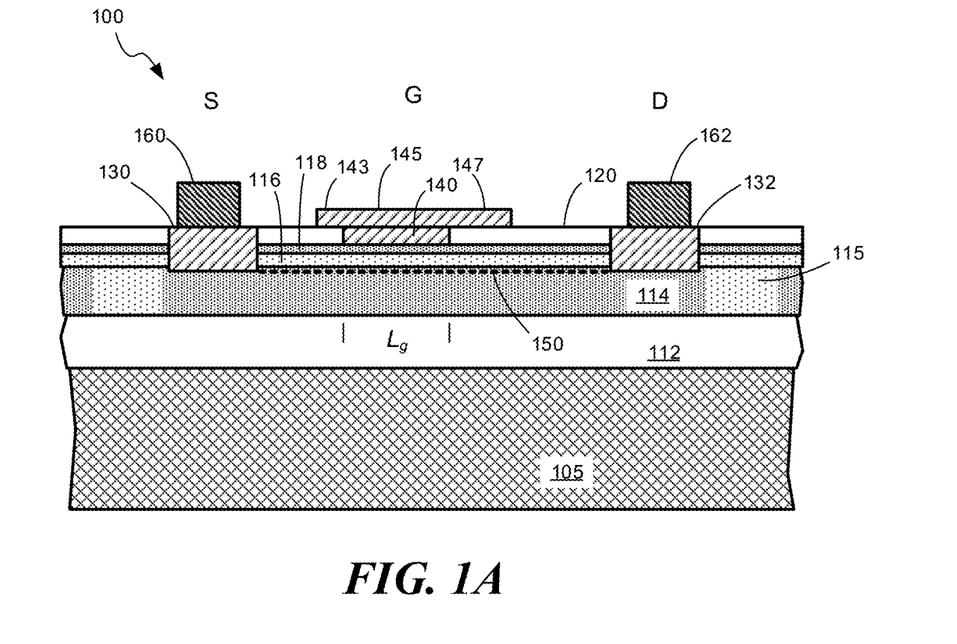
FIG. 1A is an elevation view depicting structure of a high-voltage, high-electron-mobility transistor (HEMT) comprising gallium-nitride material, according to some embodiments.

An example of an individual high-voltage HEMT structure is depicted in FIG. 1A, according to some embodiments. A high-voltage HEMT 100 may be formed as a lateral device (or formed from a plurality of lateral devices, each like that shown in the drawing), and include a source 130, a drain 132, and a gate 140 having a length $L_g$ that controls the flow of current between the drain and source. The gate length $L_g$ may be between approximately 0.1 micron and approximately 3.0 microns, according to some embodiments. The gate, source, and drain may be formed on a same side of a substrate 105 (e.g., on a process surface of the substrate). A lateral HEMT structure has the benefit of not needing through-substrate vias for connecting to a source or drain of the device, which can leave the entire backside of the device available for heat removal. Single-side electrical connections can also make integration of the high-voltage HEMT into an integrated circuit (IC), pallet, or monolithic microwave integrated circuit (MMIC) an easier task. For example, all contacts are easily accessible for wire bonding.

A high-voltage HEMT 100 may be formed using a multi-layer structure that includes a substrate 105, a buffer layer 112, a conduction layer 114, a barrier layer 116, and at least one electrically-insulating dielectric layer 120. Because of the difference in material composition between the conduction layer 114 and barrier layer 116, a two-dimensional electron gas (2DEG) forms essentially at an interface between the conduction layer 114 and barrier layer 116. Some embodiments may, or may not, include a semiconductor cap layer 118, which may be formed of a same material as the conduction layer 114. A HEMT may further include a source contact 160 and a drain contact 162.

A high-voltage HEMT 100 may further include at least one gate-connected field plate 145 that is electrically connected to the gate 140 and extends beyond edges of the gate. According to some embodiments, the gate 140 may be located closer to the source 130 than the drain 132, though the gate may be centered or located nearer the drain in other embodiments. A first extension 147 of the gate-connected field plate 145 may extend a first distance beyond an edge of the gate 140 towards the drain 132, and a second extension 143 of the gate-connected field plate 145 may extend a second distance beyond an edge of the gate 140 towards the source 130. In some implementations, an insulating passivation layer (not shown) may be formed over the gate-connected field plate 145 and source and drain contacts 160,

162. Although one gate-connected field plate is shown in FIG. 1A, two or more gate-connected field plates may be used in other embodiments. For a Schottky diode, there can be one or more anode-connected field plates.

Figure 1B:
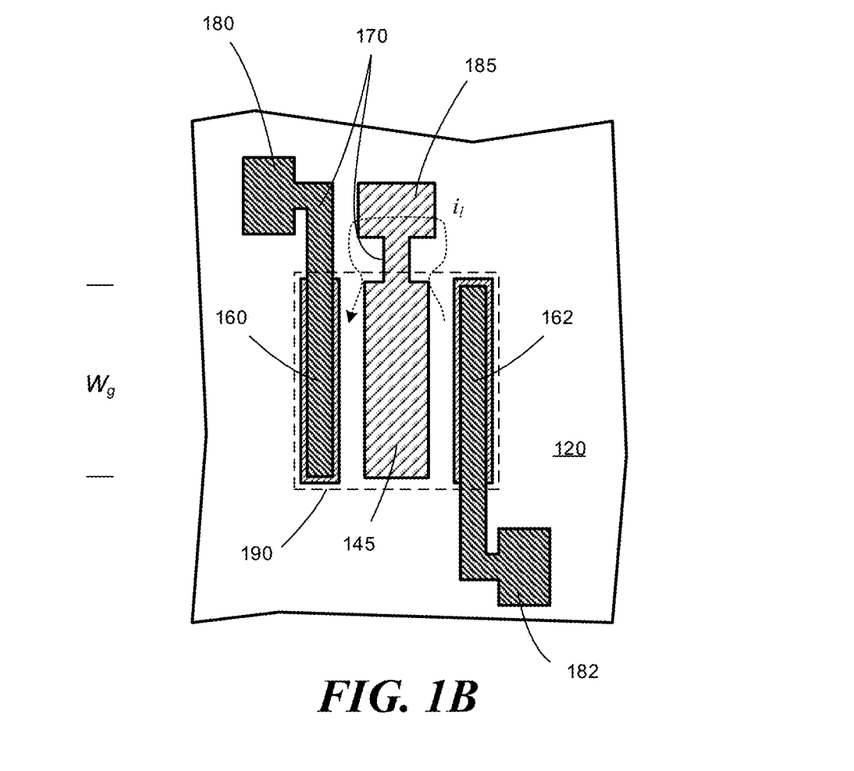
FIG. 1B depicts a plan view of an individual HEMT, according to some embodiments.

In a plan view, an individual high-voltage HEMT 100 may be arranged as depicted in FIG. 1B. The source, gate, and drain may have extended widths $W_g$ in one direction and run parallel to each other across the substrate defining an active area 190 of the device, according to some embodiments. The depicted width $W_g$ may be referred to as a peripheral length of the device. In some embodiments, a high-voltage HEMT may include conductive interconnects 170 (e.g., interconnects patterned during a metallization level) that extend between a gate or gate-connected field plate 145 and a gate contact pad 185, between a source contact 160 and a source contact pad 180, and between a drain contact 162 and a drain contact pad 182.

Drawings in FIG. 1A and FIG. 1B are for explanation purposes and are not necessarily to scale. In some cases, the contact pads are significantly larger than depicted in the drawing, and can be significantly larger than the gate, source, and drain contacts. In some implementations, the drain contact 162 and/or source contact 160 can be significantly larger than the gate-connected field plate 145. Additionally or alternatively, the interconnects 170 can be longer than those depicted in the drawing.

Figure 1C:
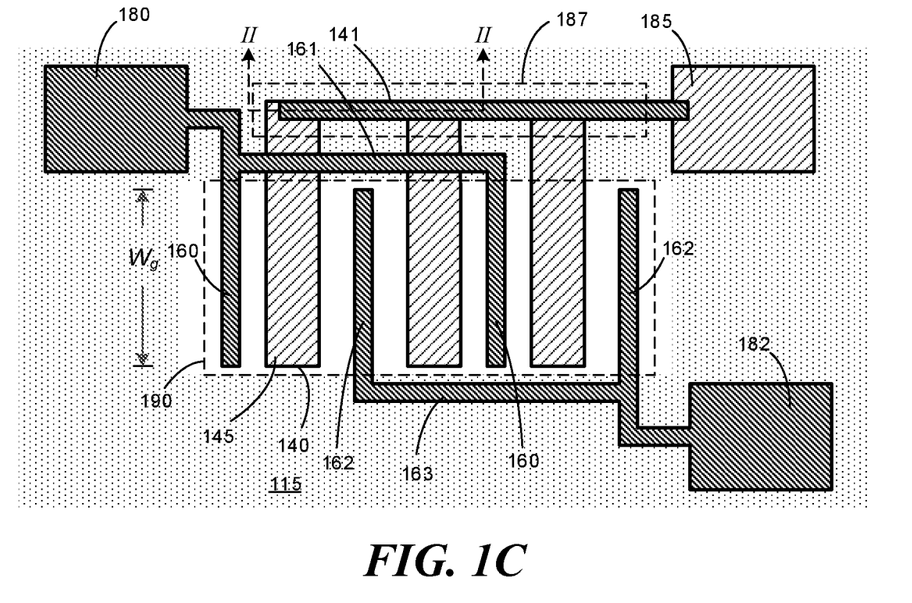
FIG. 1C depicts a plan view of a HEMT device having multiple source, gate, and drain contacts, according to some embodiments.

An individual transistor or diode may be repeated across a substrate many times. In some cases, the repeated devices are connected together in parallel, as illustrated in FIG. 1C. In the example shown, drain contacts 162 may be connected together with drain interconnects 163 and source contacts 160 may be connected together with source interconnects 161 when the structures are repeated many times across a substrate. Additionally, gates 140 and/or gate-connected field plates 145 can be connected together with gate interconnects 141. In some cases, one or more of the gate interconnects 141, drain interconnects 161, and source interconnects 163 can be part of an extrinsic field termination structure that is described further below in connection with FIG. 2.

In further detail and referring again to FIG. 1A, a high-voltage HEMT or diode may be formed on any suitable crystalline substrate 105. Example substrates include, but are not limited to, silicon (Si), silicon carbide (SiC), gallium nitride (GaN), and sapphire. According to some embodiments, the substrate 105 may comprise bulk monocrystalline silicon. In some instances, the substrate may comprise a semiconductor on insulator (SOI) substrate where the semiconductor is any of the foregoing mentioned semiconductor substrate materials. The substrate 105 may be in the form of a wafer (e.g., a Si semiconductor wafer) and have a diameter between approximately 50 mm and approximately 450 mm. In various embodiments, the surface of the substrate is monocrystalline, so that a III-nitride (e.g., GaN, AlN, AlGaN, InGaN) or any other suitable crystalline material, such as III-V, II-VI, tertiary, or quarternary semiconductor materials, may be epitaxially grown from the surface of the substrate.

Because there may be a lattice mismatch between the substrate 105 and the conduction layer 114, one or more transitional layers may be formed on the substrate and between the substrate 105 and conduction layer 114 as buffer layer 112 to ameliorate stress that would otherwise develop from the lattice mismatch. The transitional layers may be formed by epitaxial growth or deposition techniques, according to some embodiments. For example, any of the transitional layers may be formed using a chemical vapor deposition (CVD) process or atomic layer deposition (ALD) process. A CVD process may include, but not be limited to, a metal-organic chemical vapor deposition (MOCVD) process. Other deposition processes may include hydride vapor phase epitaxy (HVPE) or molecular beam epitaxy (MBE). The transitional layers may include at least a first transitional layer (e.g., AlN) deposited directly on the substrate 105 followed by one or more gallium-nitride material layers deposited on the first transitional layer. Examples of transitional layers 112 are described in, for example, U.S. Pat. Nos. 7,135,720 and 9,064,775, which are both incorporated herein by reference in their entirety. Some of the transitional layers may be compositionally graded. A total thickness of the buffer layer 112 may be between approximately 0.5 micron and approximately 4 microns.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Suitable gallium-nitride materials are described in U.S. Pat. No. 6,649,287, which is incorporated herein by reference in its entirety.

Some implementations may include additional layers (not shown) within the depicted multi-layer structure of FIG. 1A. For example, there may be one or more additional layers between the substrate 105 and conduction layer 114. These layers may include any combination of the following layers: amorphous dielectric (e.g., silicon nitride, oxide) layer(s) compositionally graded layer(s), one or more superlattices, and strain-relieving layer(s). Such layers may be included to ameliorate stresses arising from deposition of dissimilar materials and/or to improve electrical performance of the device (e.g., reduce parasitic capacitance or leakage currents).

According to some embodiments, the conduction layer 114 may comprise gallium nitride (GaN) or any suitable gallium-nitride material. The conduction layer 114 may be formed by epitaxial growth (e.g., by an MOCVD process or any suitable process for forming a crystalline gallium-nitride material), and may be deposited directly on or above the buffer layer 112. A thickness of the conduction layer may be between approximately 0.5 micron and approximately 4 microns. In some embodiments, the conduction layer may be undoped, though it may be lightly doped (for either n or p type conductivity) in other embodiments. A band-gap of the conduction layer 114 may be smaller than a band-gap of an adjacent barrier layer 116.

A barrier layer 116 may be formed using any suitable epitaxial growth process, and may be deposited directly on or above the conduction layer 114, in some embodiments. A thickness of the barrier layer 116 may be between approximately 10 nanometers and approximately 50 nanometers, though other thicknesses may be used in some cases. According to some embodiments, the barrier layer 116 may comprise any suitable gallium-nitride material, and may comprise one or more layers of different gallium-nitride materials (e.g., AlGaN and AN layers). The barrier layer may be doped for either n or p type conductivity, or may be undoped. The barrier layer 116 and conduction layer 114 may form a heterojunction, and thereby create a two-dimensional electron gas (2DEG) 150 in the conduction layer 114 adjacent to the interface between the conduction layer and barrier layer. The 2DEG 150 may provide a highly conductive path for current flowing between the source 130 and drain 132. According to some embodiments, the conduction layer 114 comprises undoped gallium nitride (GaN), and the barrier layer comprises undoped aluminum-gallium nitride (AlGaN) having an Al percentage (by mole fraction) between approximately 20% and approximately 40%.

When using the terms "on," "adjacent," or "over" to describe the locations of layers or structures, there may or may not be one or more layers of material between the described layer and an underlying layer that the layer is described as being on, adjacent to, or over. When a layer is described as being "directly" or "immediately" on, adjacent to, or over another layer, no intervening layer is present. When a layer is described as being "on" or "over" another layer or substrate, it may cover the entire layer or substrate, or a portion of the layer or substrate. The terms "on" and "over" are used for ease of explanation relative to the illustrations, and are not intended as absolute directional references. A device may be manufactured and/or implemented in other orientations than shown in the drawing (for example, rotated about a horizontal axis by more than 90 degrees.

Some embodiments may further and optionally include a semiconductor cap layer 118 formed over the barrier layer 116. The semiconductor cap layer may comprise a semiconductor material of the same type as the conduction layer 114. The cap layer 118 may or may not be doped. In some implementations, the cap layer may comprise a layer of undoped or doped GaN. The cap layer 118 may have a thickness between approximately 1 nm and approximately 10 nm. The cap layer may be formed by any suitable epitaxial deposition process (e.g., by ALD or a CVD process). Some implementations may not include a cap layer 118.

Any suitable electrically-insulating dielectric layer 120 may be used to isolate one or more gate-connected field plates 145 from the barrier layer 116 or cap layer 118. Example insulator materials include, but are not limited to silicon nitride, silicon oxide, hafnium oxide, aluminum oxide, lanthanum oxide, titanium oxide, zinc oxide, zirconium oxide, gallium oxide, scandium oxide, aluminum nitride, and hafnium nitride. An insulating layer may be formed by any suitable deposition process, such as chemical vapor deposition, plasma-enhanced chemical vapor deposition, atomic layer deposition, sputtering, or electron-beam evaporation. Other deposition processes may be used in other embodiments.

According to some embodiments, one or more of the gate 140, source 130, drain 132, gate-connected field plate 145, and source and drain contacts 160, 162 may be formed from a metal, a metal silicide, metal alloys, a plurality of metal layers, or a highly-doped amorphous semiconductor. In some implementations, any of the gate, source, drain, gate-connected field plate, and contacts may comprise one or more layers of the following metals and/or metal alloys in any suitable combination: titanium, nickel, chromium, platinum, palladium, osmium, aluminum, gold, tungsten, rhenium, tantalum, and alloys of titanium and tungsten. In some cases, one or more of the following silicides may be used: platinum silicide, tungsten silicide, nickel silicide, cobalt silicide, titanium silicide, molybdenum silicide, and tantalum silicide. Any of the gate, source, drain, and field-plate elements may be formed by a physical deposition process (e.g., electron-beam deposition, sputtering, or plating process). A thickness of a gate, source, and/or drain may be between approximately 20 nm and approximately 200 nm, though other thicknesses may be used in some cases. A thickness of a gate-connected field plate 145 may be between approximately 100 nm and approximately 1.5 microns. A thickness of a source and/or drain contact 160, 162 may be between approximately 200 nm and approximately 2 microns.

In some embodiments, the gate 140, source 130, drain 132, and gate-connected field plate material 145 may be formed from different material compositions. For example, source 130 and drain 132 may comprise a multi-layer structure such as, but not limited to, Ti/Al/Ni/Au, Ti/Al/W, or Ta/Al/Ta. The gate 140 may comprise a multi-layer structure such as, but not limited to, Ni/Pd/Au/Ti, Ni/Pt/Au/Ti, Ni/Ti/Al/W, Ni/W/Al/W, Ni/Ta/Al/Ta, Ni/Ta/Al/W, Ni/NiO/Al/W, Ni/NiO/Ta/Al/Ta, Ni/NiO/Ta/Al/W, W/Al/W, Ni/WN/Al/W, Ni/NiO/W/Al/W, Ni/NiO/WN/Al/W, WN/Al/W, or Pt/Au/Ti compositions. A gate-connected field plate 145 may comprise, but not be limited to, Ti/Pt/Au, Al/Cu, or TiN/Cu compositions.

In some implementations, isolation regions 115 may be formed around one or more HEMTs to prevent inflow or outflow of leakage current to or from a HEMT to an adjacent circuit element. Isolation regions may comprise shallow trench isolation structures (e.g., trenches filled with an oxide or other insulator), in some cases, or may comprise regions of damaged crystalline semiconductor in other embodiments. In some cases, an isolation region can be formed using a mesa etching process in which regions of the semiconductor around the active device are etched away, e.g., etched back to an electrically-insulating layer. The inventors have recognized and appreciated that effective isolation regions may be formed in gallium-nitride materials by damaging the crystal lattice structure with ion implantation (e.g., implanting nitrogen, argon, boron, or phosphorus). In some embodiments, an isolation region may be formed around one or more HEMTs by implanting a peripheral region with nitrogen at multiple different energies. The different implantation energies are used to extend the damaged region around the HEMT from the top of the barrier layer 116 (or cap layer if present) to a depth of at least 100 nm. Forming isolation regions 115 by ion implantation can be easier than process steps associated with forming a field oxide around the HEMTs. In some cases, forming isolation regions 115 by ion implantation can effectively isolate a device without significantly affecting device performance, which may occur when etching away regions around the device to form an isolated mesa.

Figure 2:
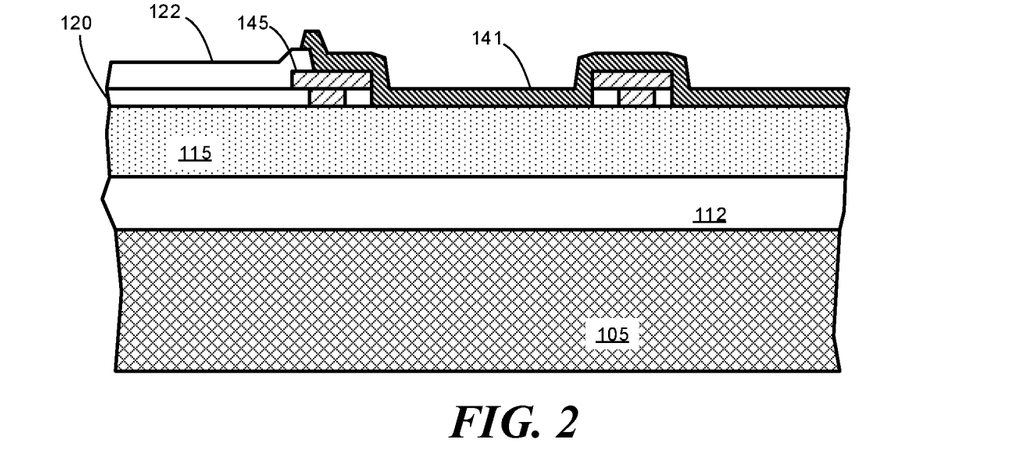
FIG. 2 is an elevation view of interconnect structure in a region outside the active area, as indicated in FIG. 1C.

The inventors have recognized and appreciated that structure in the extrinsic or external region of transistors and diodes can influence electric field termination in a device and affect how the device ages with time. An extrinsic or external region of a device comprises a region around the device's active region (which may be referred to as intrinsic or internal region). The extrinsic region can include structure associated with the device (e.g., interconnects of the device, conductive vias, and contact pads), whereas the intrinsic region includes at least the device's active region. More particularly, the inventors recognized that the structure of features in the extrinsic region can significantly affect the way in which a device's leakage current can change with age of the device. An example of extrinsic field termination structure that can significantly reduce gate leakage current in transistors is depicted in FIG. 2 in elevation view.

In embodiments, extrinsic field termination structure can comprise interconnects (e.g., gate interconnect 141) that lie outside an active region of one or more devices, such as one or more transistors or diodes. Extrinsic field termination structure can further include one or more isolation regions 115, as described above, lying under the interconnects. In some cases, the isolation region 115 may partially or completely surround the one or more devices. The isolation region 115 may extend through one or more epitaxial layers formed above a substrate 105. For example, an isolation region 115 may extend through a conduction layer 114.

Extrinsic field termination structure can also include one or more deposited, electrically-insulating layers, such as one or more electrically-insulating layers 120, 122, which may be located over the isolation region 115. In some cases, a second insulating layer 122 may be a passivation layer. According to some embodiments, an integrated device can comprise a plurality of individual transistors or diodes that are connected in parallel to increase the power handling capability of the integrated device. Because there are a plurality of similar devices connected in parallel, like electrodes (e.g., gates or anodes) can be connected together with interconnects (e.g., gate interconnects 141) that lie outside the active region 190 of the transistors or diodes, as depicted in FIG. 1C, for example.

In some implementations, a substrate outside the active region can be converted to form an isolation region 115 by ion implantation, as described above for example. However, in other implementations, the isolation region 115 can be formed by other methods as described above (e.g., shallow trench isolation or mesa etch isolation). The isolation region 115 may completely surround the device, as illustrated in FIG. 1C, or may partially surround the device in some cases. In some cases, there can be a plurality of separated isolation regions that are located around, or partly around, an active device.

In embodiments, the interconnects 141 can be formed in a region lying over the isolation region(s) 115. In preferred implementations, the interconnects 141 can directly contact the isolation region 115, as depicted in FIG. 2. For example, an electrically-insulating passivation or dielectric layer 122 (not depicted in FIG. 1C so that the isolation region 115 can be seen) and/or electrically-insulating dielectric layer 120 can be etched away to form an opening into which the interconnect 141 can be deposited directly onto the material of the isolation region 115. In some implementations, there can be a conductive layer located between the interconnect 141 and the isolation region 115. The conductive material between the interconnect 141 and the isolation region 115 can be a different material than the material used for the interconnect. For example, the conductive material may be used to improve adhesion of the interconnect 141 to the isolation region 115. As an example, a thin layer of titanium may be deposited and patterned on the isolation region to improve adhesion of the interconnects.

At least a portion of the gate leakage current may travel along an interface between the upper-most semiconductor layer (e.g., the barrier layer 116 or cap layer 118, if the cap layer is present, and/or upper most semiconductor material of the isolation region 115), and the adjacent insulating layer. For example, leakage current may travel along an interface between cap layer 118 and dielectric layer 120, referring to FIG. 1A. In some cases, hot electrons may hop from the 2DEG to interfacial traps at such interfaces and move from trap to trap along these interfaces. As a result, a gate leakage current it path for electrons may run from a source region of a transistor near source electrode 162, around the gate contact pad 185 (see FIG. 1B) via the interfacial traps, and to a drain region of the transistor. In some implementations, some traps may be created in an adjacent insulating layer (e.g., dielectric layer 120) due to damage resulting from ion implantation to form the isolation region 115. Some traps may be interfacial traps due to the juxtaposition of the two different materials (e.g., ion-damaged gallium-nitride material and an ion-damaged dielectric material, such as silicon nitride).

According to some embodiments, removing the adjacent insulating layer or layers and depositing the interconnects directly on the semiconductor material (as depicted in FIG. 2) can remove the traps and essentially block the leakage current path. In some cases, there can be one or more etched vias that removes the one or more adjacent insulating layers 120, 122 and that exposes a surface of the underlying semiconductor material, such as isolation region 115, so that the interconnects can be deposited on or directly on the underlying semiconductor material. In some embodiments, one or more upper semiconductor layers may be removed, such as cap layer 118 and/or barrier layer 116. According to some implementations, the via(s) can be larger in size than the deposited interconnect, so as to remove additional insulating layer material around the interconnect 141. For example, a via for a gate interconnect 141 may have a size (depicted by a dashed rectangle 187 in FIG. 1B) that is larger than the gate interconnect 141.

In some instances, a surface of the exposed upper-most semiconductor layer can be treated to suppress or remove traps. For example, the surface may be subjected to an oxygen plasma treatment for a period of time. The oxygen plasma treatment may also form a thin (e.g., less than 5 nm thick) native oxide layer at the surface of the semiconductor, such as a gallium-oxide layer for semiconductors comprising gallium-nitride material.

In cases where the surface of the upper-most semiconductor layer has been treated to suppress or remove traps, an insulating layer can be deposited between the interconnect 141 and isolation region 115. Such a deposited layer may not exhibit ion damage in embodiments where the isolation region is formed by ion-implantation. For example, the insulating layer may be deposited after etching a via 187 and not subjected to ion implantation. Such an insulating layer can have a thickness between 1 nm and 10 nm according to some embodiments, or between 5 nm and 50 nm according to some embodiments, or between 10 nm and 500 nm according to some embodiments.

According to some embodiments, an interconnect 141, 161, 163 of an extrinsic field termination structure can be formed as part of an ohmic contact metallization deposition. For example, an interconnect can comprise a multi-layer structure such as, but not limited to, Ni/Pd/Au/Ti, Ni/Pt/Au/Ti, Ni/Ti/Al/W, Ni/W/Al/W, Ni/Ta/Al/Ta, Ni/Ta/Al/W, Ni/NiO/Al/W, Ni/NiO/Ta/Al/Ta, Ni/NiO/Ta/Al/W, W/Al/W, Ni/WN/Al/W, Ni/NiO/W/Al/W, Ni/NiO/WN/Al/W, WN/Al/W, or Pt/Au/Ti compositions. In some embodiments, an interconnect can generally run in a direction that is at an angle (e.g., approximately 90 degrees) to a direction in which the connected electrodes run. For example, gate interconnects 141 illustrated in FIG. 1C run essentially perpendicular to the gates 140.

According to some implementations, one or more interconnects of a particular type together with its connected electrodes can partially or fully surround a different electrode of the device. For example, in FIG. 1C, the left two gates 140 and connecting gate interconnect 141 partially surround a drain contact 162 and underlying drain 132. By adding a second gate interconnect to connect the lower ends of the gates 140, the drain contact 162 and drain 132 could be fully surrounded by the left two gates 140 and connecting gate interconnects 141. Similarly, the right two gates 140 and connecting gate interconnect 141 partially surround a source contact 160 and source 130, but could be made to fully surround the source contact 160 and source 130.

Various combinations of the above features are possible in embodiments. For example, any of the layouts of interconnects for surrounding or partially surrounding an electrode of a certain type can be combined with any type of isolation region (e.g., isolation region formed by ion implantation, shallow trench isolation process, or mesa etch). Additionally, any of the materials for ohmic contacts can be used with any of the foregoing combinations.

The extrinsic structure can also aid in terminating electric fields at ends of the device electrodes where the fields produced in the active regions of the device may not fully terminate into adjacent electrodes of the device. For example and referring again to FIG. 1C, electric fields extending from the drains 132 (which underlie the drain contacts 162) may fringe outward at the ends of the drains. Locating the gate interconnects 141 at or near the substrate level and in close proximity to the ends of the drains can aid in terminating these fringing electric fields. In some cases, the interconnects 141, 161, 163 are located between 5 microns and 20 microns from an end of an adjacent electrode. In some cases, the interconnects 141, 161, 163 are located within 15 microns of an end of an adjacent electrode. In some cases, the interconnects 141, 161, 163 are located within 10 microns of an end of an adjacent electrode. In some cases, the interconnects 141, 161, 163 are located within 5 microns of an end of an adjacent electrode.

Figure 3:
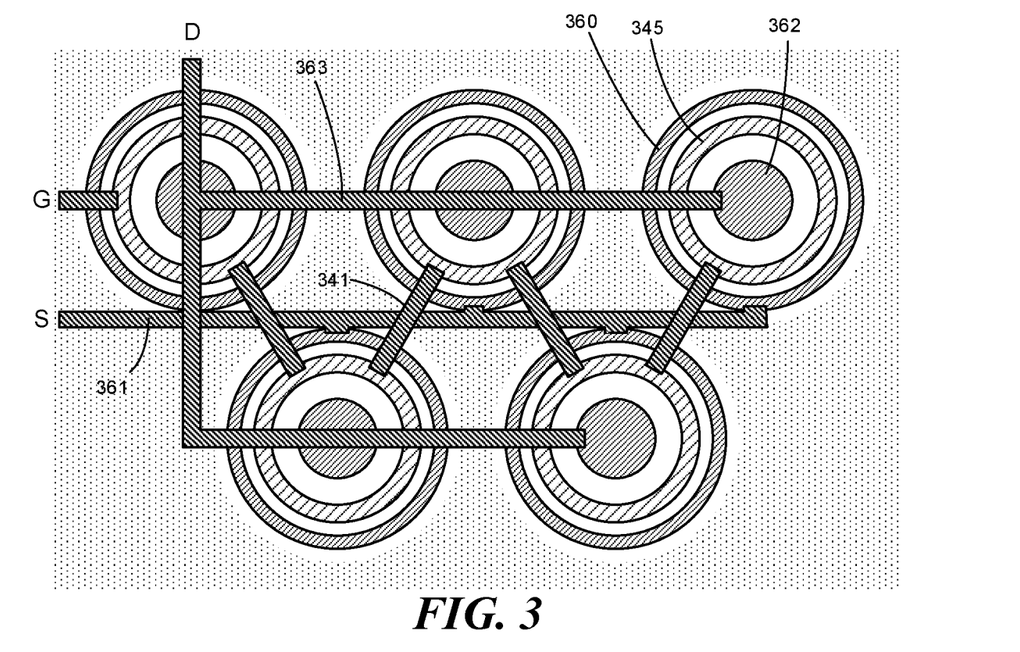
FIG. 3 illustrates transistors having circularly patterned electrodes, according to some embodiments.

According to some embodiments, circular or quasi-circular active devices can be formed, so that there are no ends to electrodes of the active devices. At least one electrode of a circular or quasi-circular device may be circular or quasi-circular. Quasi-circular devices are devices with polygonal shapes. An example of a high-power transistor having a plurality of circular devices is depicted in FIG. 3. Each transistor can have a circular drain 362, a circular gate and gate-connected field plate 345, and a circular source 360. The different device electrodes can be connected together by gate G interconnects 341, source S interconnects 361, and drain D interconnects 363.

Figure 4A:
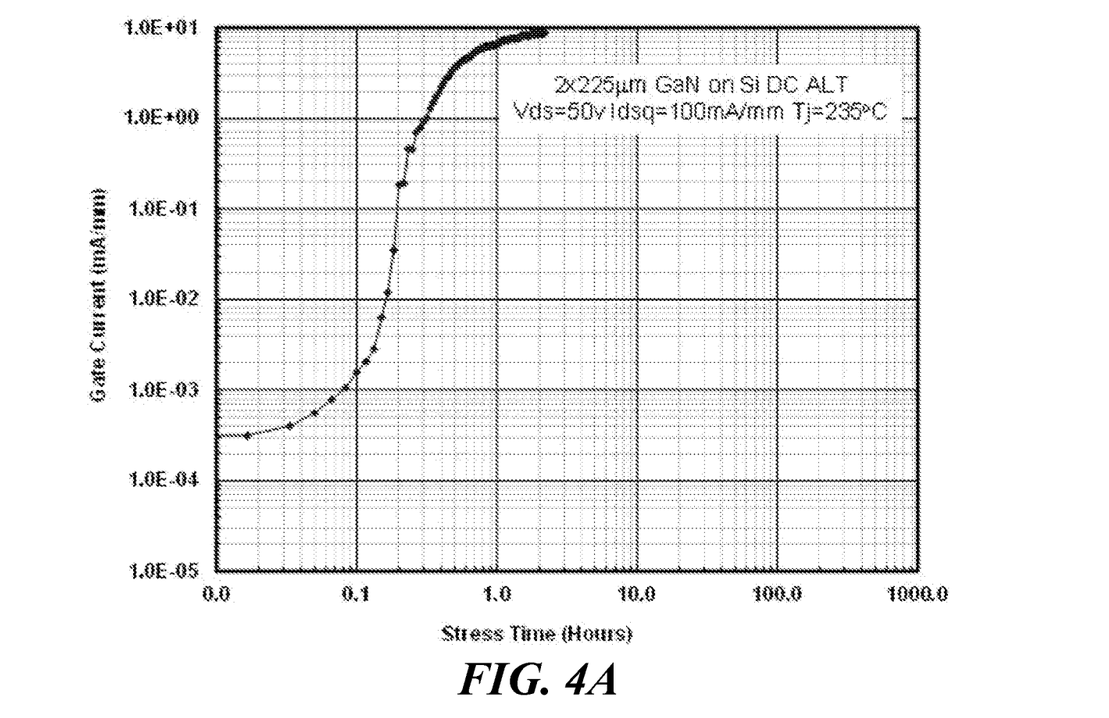
FIG. 4A illustrates gate leakage current as a function of time for a HEMT having a conventional interconnect structure.
Figure 4B:
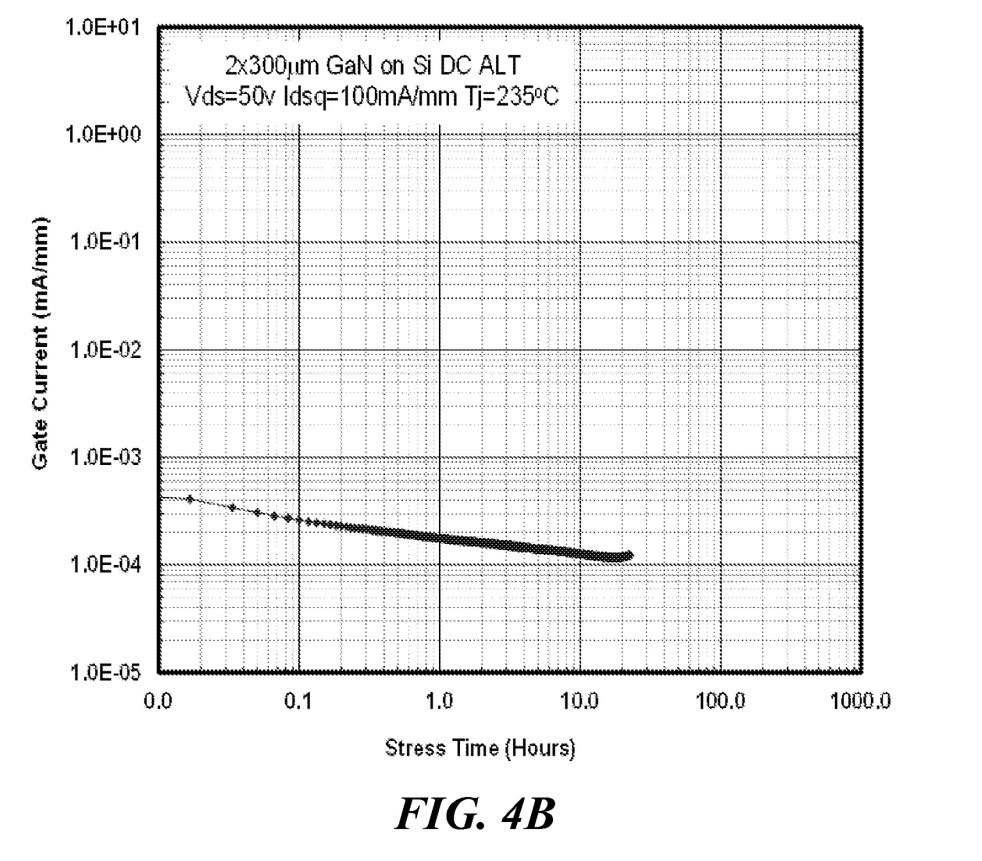
FIG. 4B illustrates gate leakage current as a function of time for a HEMT having an interconnect structure of the present embodiments.

Improvements in reducing gate leakage current achieved with the present embodiments is illustrated with the plots in FIG. 4A and FIG. 4B. Increased gate or anode leakage current as a function of time can be a fail mechanism for integrated devices, and may not commonly be reported by developers of gallium-nitride devices. GaN HEMTs designed for use in RF applications can utilize a Schottky barrier for the gate electrode—a configuration chosen to insure tolerable gain. Under initial, normal operation, the gate electrode can exhibit acceptable leakage current values, e.g., significantly less than 1 mA per mm of device peripheral length.

FIG. 4A plots gate leakage current for a HEMT transistor device in which extrinsic gate interconnects are located over an insulating layer (a silicon-nitride layer that was approximately 400 nm thick) through which ion implantation was performed to creating an isolation region 115. Referring again to FIG. 2, the silicon-nitride layer for this device was located between the interconnect 141 and the isolation region 115. FIG. 4A plots the associated temporal behavior of the gate leakage current under stress testing conditions. The tested GaN-on-Si HEMT device has a 0.4 micron gate length. The bias conditions to provide accelerated stress were $V_{DD}$=50V, and $I_D$=100 mA/mm of peripheral length (which corresponded to 5 W/mm of dissipated power), The base plate temperature on which the device was mounted was adjusted to obtain a surface temperature of approximately 235° C. The observed gate leakage current increases by more than four orders of magnitude in less than one hour of operation before stabilizing at a level ~10 mA/mm, a level that is well beyond usable levels.

FIG. 4B depicts the gate leakage current temporal behavior for a GaN-on-Si HEMT device has a 0.4 micron gate length and for which the extrinsic gate interconnects were deposited directly on the material of the isolation region 115, as illustrated in FIG. 2. Under same stress conditions described for the device of FIG. 4A, the gate leakage current starts out at a similar level (~5×10$^{-4}$ mA/mm) and continues to decrease after more than 20 hours of operation under accelerated stress. The result represents a reduction in gate leakage current over the testing conditions of more than four orders of magnitude compared to a conventional device.

The disclosed semiconductor devices may be embodied in different configurations as described below. Any of the listed configurations may further include one or more technical features described above.

(1) An integrated device comprising a semiconductor device having an active region; a first insulating layer formed over at least a portion of the active region; an isolation region lying outside the active region and lacking the first insulating layer; and a conductive interconnect formed over the isolation region.

(2) The integrated device of configuration (1), wherein the interconnect is formed directly on the isolation region.

(3) The integrated device of configuration (1), further comprising a second insulating layer located between the interconnect and isolation region.

(4) The integrated device of any one of configurations (1) through (3), wherein the second insulating layer does not exhibit damage from ion implantation.

(5) The integrated device of any one of configurations (1) through (4), further comprising a plurality of additional semiconductor devices, wherein the interconnect connects an electrode of the semiconductor device to additional electrodes of the additional semiconductor devices of a same type as the electrode.

(6) The integrated device of any one of configurations (1) through (5), wherein the semiconductor device is a transistor or a diode.

(7) The integrated device of configuration (6), wherein the semiconductor device comprises gallium-nitride material.

(8) The integrated device of configuration (6) or (7), wherein the semiconductor device can output between 50 Watts and 1000 Watts.

(9) The integrated device of configurations (6) through (8), wherein an electrode of the semiconductor device is circular or quasi-circular.

(10) The integrated device of any one of configurations (1) through (9), wherein the isolation region comprises damaged semiconductor material.

(11) The integrated device of any one of configurations (1) through (10) having a gate leakage current of less than 1 microamp per millimeter of peripheral length after 10 hours of operating at 5 Watts per millimeter of peripheral length, 50 Volts drain-to-source bias, and 235° C. operating environment temperature.

Methods for making devices of the present embodiments and configurations above are also possible and listed below.

(12) A method of making a semiconductor device comprising acts of forming a semiconductor device having an active region on a substrate; forming a first insulating layer that covers at least a portion of the active region; creating an isolation region in an area outside the active region; forming a via over the isolation region wherein a portion of the first insulating layer is removed from the isolation region; and depositing a conductive interconnect that extends into the via and onto the isolation region.

(13) The method of (12), wherein the conductive interconnect is deposited directly on the isolation region.

(14) The method of (12), further comprising forming a second insulating layer on the isolation region in the via.

(15) The method of (14), wherein the second insulating layer is formed using an oxygen plasma treatment.

(16) The method of any of (12) through (15), wherein forming the semiconductor device comprises forming a transistor or a diode.

(17) The method of any of (12) through (16), wherein forming the semiconductor device comprises depositing gallium-nitride material.

(18) The method of any of (12) through (17), wherein creating the isolation region comprises performing ion implantation to damage crystalline semiconductor.

(19) The method of any of (12) through (18), further comprising: forming a plurality of additional semiconductor devices of a same kind as the semiconductor device on the same substrate; and connecting the semiconductor device and additional semiconductor devices to operate in parallel.

(20) The method of (19), further comprising depositing the conductive interconnect to connect together electrodes of a same type for the semiconductor device and additional semiconductor devices.

CONCLUSION

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting.

What is claimed is:

1. An integrated device comprising:
   a semiconductor device having an active region in a conduction layer;
   an isolation region in the conduction layer, the isolation region extending around the semiconductor device in an area outside the active region;
   an insulating layer formed over at least a portion of the active region and over at least a portion of the isolation region;
   a via outside the active region, the via extending through the insulating layer and down to the isolation region in the conduction layer; and
   a conductive interconnect within the via outside the active region and directly on the isolation region in the conduction layer.

2. The integrated device of claim 1, wherein the conductive interconnect comprises titanium directly on the isolation region in the conduction layer.

3. The integrated device of claim 1, further comprising a plurality of additional semiconductor devices, wherein the conductive interconnect connects an electrode of the semiconductor device to additional electrodes of the plurality of additional semiconductor devices of a same type as the electrode.

4. The integrated device of claim 1, wherein the semiconductor device is a transistor or a diode.

5. The integrated device of claim 1, wherein the semiconductor device comprises gallium-nitride material.

6. The integrated device of claim 1, wherein the semiconductor device can output between 50 Watts and 1000 Watts.

7. The integrated device of claim 1, wherein an electrode of the semiconductor device is circular or quasi-circular.

8. The integrated device of claim 1, wherein the isolation region comprises damaged semiconductor material.

9. The integrated device of claim 1, wherein:
   the semiconductor device comprises a transistor;
   the semiconductor device comprises gallium-nitride material; and
   the transistor has a gate leakage current of less than 1 microamp per millimeter of peripheral length after 10 hours of operating at 5 Watts per millimeter of peripheral length, 50 Volts drain-to-source bias, and 235° C. operating environment temperature.

10. A method comprising:
    forming a semiconductor device having an active region in a conduction layer over a substrate;
    forming an insulating layer over at least a portion of the active region and over at least a portion of the conduction layer outside the active region;
    creating an isolation region in the conduction layer, the isolation region extending around the semiconductor device in an area outside the active region;
    forming a via through the insulating layer outside the active region, the via extending down to the isolation region in the conduction layer; and
    depositing a conductive interconnect directly on the isolation region within the via outside the active region.

11. The method of claim 10, wherein the conductive interconnect comprises titanium directly on the isolation region in the conduction layer.

12. The method of claim 10, wherein forming the semiconductor device comprises forming a transistor or a diode.

13. The method of claim 10, wherein forming the semiconductor device comprises depositing gallium-nitride material.

14. The method of claim 10, wherein creating the isolation region comprises performing ion implantation to damage crystalline semiconductor.

15. The method of claim 10, further comprising:
forming a plurality of additional semiconductor devices of a same kind as the semiconductor device over the substrate; and
connecting the semiconductor device and the plurality of additional semiconductor devices to operate in parallel.

16. The method of claim 15, further comprising depositing the conductive interconnect to connect together electrodes of a same type for the semiconductor device and the plurality of additional semiconductor devices.

17. An integrated device comprising:
an active region in a conduction layer;
an isolation region extending around the active region;
an insulating layer formed over at least a portion of the active region and over at least a portion of the isolation region;
a via outside the active region, the via extending through the insulating layer and down to the isolation region; and
a conductive interconnect within the via outside the active region and directly on the isolation region.

18. The integrated device of claim 17, wherein the conductive interconnect comprises titanium directly on the isolation region.

19. The integrated device of claim 17, wherein an electrode of the integrated device is circular or quasi-circular.

20. The integrated device of claim 17, wherein the isolation region comprises damaged semiconductor material.

* * * * *